US007902025B2

(12) United States Patent
Hayashi et al.

(10) Patent No.: US 7,902,025 B2
(45) Date of Patent: Mar. 8, 2011

(54) METHOD OF MANUFACTURING SEMICONDUCTOR DEVICE

(75) Inventors: Tetsuya Hayashi, Yokosuka (JP);
Masakatsu Hoshi, Yokohama (JP);
Yoshio Shimoida, Yokosuka (JP);
Hideaki Tanaka, Yokohama (JP);
Shigeharu Yamagami, Yokohama (JP)

(73) Assignee: Nissan Motor Co., Ltd., Yokohama-shi (JP)

( * ) Notice: Subject to any disclaimer, the term of this patent is extended or adjusted under 35 U.S.C. 154(b) by 126 days.

(21) Appl. No.: 11/773,649

(22) Filed: Jul. 5, 2007

(65) Prior Publication Data

US 2008/0009089 A1    Jan. 10, 2008

(30) Foreign Application Priority Data

Jul. 6, 2006  (JP) ................... 2006-186560

(51) Int. Cl.
*H01L 21/336* (2006.01)
(52) U.S. Cl. ......... 438/270; 438/191; 438/767; 438/770; 257/192; 257/E21.407; 257/E21.093; 257/E21.103
(58) Field of Classification Search ........... 257/E21.065, 257/E21.054, E21.086, 192, E21.407, E21.093, 257/E21.103; 438/285, 191, 270, 767, 770
See application file for complete search history.

(56) References Cited

U.S. PATENT DOCUMENTS

| | | | | |
|---|---|---|---|---|
| 5,976,936 A * | 11/1999 | Miyajima et al. | ............. | 438/268 |
| 6,002,143 A * | 12/1999 | Terasawa | ......................... | 257/77 |
| 6,228,720 B1 * | 5/2001 | Kitabatake et al. | ........... | 438/268 |
| 2005/0009255 A1 | 1/2005 | Chiola et al. | | |
| 2005/0224838 A1 | 10/2005 | Tanaka et al. | | |
| 2006/0060871 A1 * | 3/2006 | Beach | .............................. | 257/94 |
| 2006/0060917 A1 * | 3/2006 | Hayashi et al. | ................ | 257/330 |
| 2006/0068537 A1 * | 3/2006 | Hayashi et al. | ................ | 438/197 |
| 2007/0221955 A1 * | 9/2007 | Shimoida et al. | .............. | 257/194 |

FOREIGN PATENT DOCUMENTS

| | | |
|---|---|---|
| EP | 1 587 147 A2 | 10/2005 |
| EP | 1 641 030 A2 | 3/2006 |
| JP | 2003-318398 A | 11/2003 |
| JP | 2006-80273 A | 3/2006 |

* cited by examiner

*Primary Examiner* — Thanh V Pham
*Assistant Examiner* — Maria Ligai
(74) *Attorney, Agent, or Firm* — Foley & Lardner LLP

(57) ABSTRACT

A semiconductor substrate made of a semiconductor material is prepared, and a hetero semiconductor region is formed on the semiconductor substrate to form a heterojunction in an interface between the hetero semiconductor region and the semiconductor substrate. The hetero semiconductor region is made of a semiconductor material having a bandgap different from that of the semiconductor material, and a part of the hetero semiconductor region includes a film thickness control portion whose film thickness is thinner than that of the other part thereof. By oxidizing the hetero semiconductor region with a thickness equal to the film thickness of the film thickness control portion, a gate insulating film adjacent to the heterojunction is formed. A gate electrode is formed on the gate insulating film. This makes it possible to manufacture a semiconductor device including the gate insulating film with a lower ON resistance, and with a higher insulating characteristic and reliability.

7 Claims, 9 Drawing Sheets

METHOD OF MANUFACTURING SEMICONDUCTOR DEVICE

BACKGROUND OF THE INVENTION

1. Field of the Invention

The present invention relates to a method of manufacturing a semiconductor device having a gate insulating film adjacent to a heterojunction.

2. Description of the Related Art

Silicon Carbide has a dielectric breakdown electric field intensity which is one digit larger than that of silicon. Like silicon, silicon carbide can be thermally oxidized. For these reasons, silicon carbide draws attention as a next-generation semiconductor material. It is highly expected that silicon carbide may be applied particularly to electric power conversion devices. Against this background, there has been proposed a low-loss power transistor with a higher breakdown voltage which is formed of a silicon carbide material. In order for a power transistor to have a low-loss characteristic, it is essential that the transistor have a lower ON resistance. With this taken in consideration, a field effect transistor disclosed in Japanese Patent Application Laid-open Publication No. 2003-318398 has been proposed as an example of a structure of a power transistor which makes it possible to effectively reduce the ON resistance of the power transistor. In the case of this field effect transistor, an N⁻ type silicon carbide epitaxial region is formed on an N⁺ type silicon carbide substrate, and a polysilicon layer whose bandgap is different from that of silicon carbide is formed on a predetermined area in the silicon carbide epitaxial region. In addition, the polysilicon layer forms a heterojunction with the silicon carbide epitaxial region. Furthermore, a gate electrode is arranged adjacent to this heterojunction portion with a gate insulating film in between.

SUMMARY OF THE INVENTION

In the case of the silicon carbide semiconductor device described in Japanese Patent Application Laid-open Publication No. 2003-318398, however, a method of forming the gate insulating film adjacent to the heterojunction portion brings about the following problems. In a case where the gate insulating film is formed by thermal oxidation, it is difficult to form a thermal oxide film with a uniform film thickness in the heterojunction portion. This is because the silicon carbide epitaxial region is different from the polysilicon layer in thermal oxidation rate to a large extent. In other words, if a high-quality gate insulating film is obtained by thermal oxidation, an oxide film formed in the polysilicon layer is inevitably far thicker in film thickness than an oxide film formed in the silicon carbide epitaxial region. As a result, no sufficient electrical field reaches the polysilicon layer in the heterojunction portion, and this increases the ON resistance. By contrast, if a gate insulating film is formed by chemical vapor deposition (CVD), a sufficient gate field is applied to the heterojunction portion. This is because a gate insulating film with a uniform film thickness is formed in the heterojunction portion. However, the insulating film formed by CVD is inferior to the thermal oxide film in a quality as an insulating film. This limits improvement in an insulating characteristic and reliability of the insulating film formed by CVD.

The present invention has been made for the purpose of solving the foregoing problems with the related art. An object of the present invention is to provide a method of manufacturing a semiconductor device including a gate insulating film with a lower ON resistance, a higher insulating characteristic and a higher reliability by forming a high-quality insulating film with a substantially uniform film thickness.

The present invention is embodied as the method of manufacturing a semiconductor device which has the following characteristics. First of all, a semiconductor substrate made of a semiconductor material is prepared. Subsequently, a hetero semiconductor region is formed on the semiconductor substrate in order to form a heterojunction in the interface between the hetero semiconductor region and the semiconductor substrate. This hetero semiconductor region is made of a semiconductor material whose bandgap is different from that of the semiconductor material of the semiconductor substrate, and has a film thickness control portion whose film thickness is thinner than any other portion. This hetero semiconductor region is oxidized with a thickness equal to the film thickness of the film thickness control portion, and thereby a gate insulating film is formed adjacent to the heterojunction. Subsequently, a gate electrode is formed on the gate insulating film. The present invention makes it possible to form the gate insulating film in a vicinity of the heterojunction, which functions as a switch, with a substantially uniform film thickness by oxidizing the hetero semiconductor region. This accordingly makes it possible to provide a method of manufacturing a highly-reliable semiconductor device with a better ON resistance and a higher insulating characteristic.

BRIEF DESCRIPTION OF THE DRAWINGS

Exemplary embodiments of the invention will become more fully apparent from the following description and appended claims, taken in conjunction with the accompanying drawings. Understanding that these drawings depict only exemplary embodiments and are, therefore, not to be considered limiting of the invention's scope, the exemplary embodiments of the invention will be described with additional specificity and detail through use of the accompanying drawings in which:

DETAILED DESCRIPTION OF THE PREFERRED EMBODIMENTS

Figure 1:
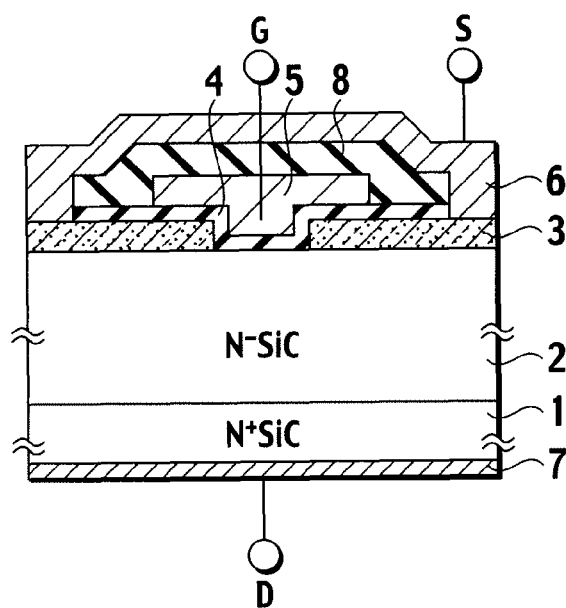
FIG. 1 is a cross-sectional view showing a configuration of a semiconductor device according to a first embodiment of the present invention.

Descriptions will be provided hereinafter for embodiments of the present invention by referring to the drawings. Components which are the same among the drawings are denoted by the same reference numerals.

First Embodiment

Descriptions will be provided for a configuration of a semiconductor device according to a first embodiment of the present invention by referring to FIG. 1. FIG. 1 is a cross-sectional view showing the semiconductor device in which two structural unit cells are opposite to each other. The first embodiment will be described citing an example of the semiconductor device using silicon carbide as a substrate material. The semiconductor device includes: a semiconductor substrate (1, 2) of a first conduction type (N type); a hetero semiconductor region 3 forming a heterojunction on a main surface of the semiconductor substrate (1, 2); a gate insulating film 4 arranged adjacent to the heterojunction; a gate electrode 5 arranged on the gate insulating film; a source electrode 6 connected to the hetero semiconductor region 3; and a drain electrode 7 connected to the semiconductor substrate (1, 2).

The semiconductor substrate (1, 2) is formed of single crystal silicon carbide, and includes an $N^+$ type substrate region 1 made of 4H-polytype silicon carbide and an $N^-$ type drift region 2 arranged on the substrate region 1, for example. The hetero semiconductor region 3 is formed, for example, of N type polysilicon, and arranged abutting on the main surface opposite to a junction surface between the drift region 2 and the substrate region 1.

A hetero semiconductor material (polysilicon) constituting the hetero semiconductor region 3 has a bandgap which is different from a bandgap of the semiconductor material (silicon carbide) constituting the semiconductor substrate (1, 2). Specifically, the heterojunction between silicon carbide and polysilicon which are materials with different bandgaps is formed in the junction portion between the drift region 2 and the hetero semiconductor region 3, and an energy barrier exists in the junction interface. In addition, the hetero semiconductor region 3 is selectively formed in portions except for a boundary portion between the two structural unit cells opposite to each other, as shown in FIG. 1.

The gate insulating film 4 made, for example, of a silicon oxide film is formed in a way that the gate insulating film 4 contacts a part of the junction surface between the hetero semiconductor region 3 and the drift region 2. Specifically, the gate insulating film 4 is formed on the top and sides of the hetero semiconductor region 3, and on the top of the drift region 2 in the boundary portion of the two structural unit cells. The gate electrode 5 is arranged on the gate insulting film 4, particularly on the boundary portion of the two structural unit cells opposite to each other The source electrode 6 is connected to an opposing surface opposite to the junction surface between the hetero semiconductor region 3 and the drift region 2. The drain electrode 7 is connected to the substrate region 1. The source electrode 6 is connected to the hetero semiconductor region 3 in a way that the source electrode 6 spans the two structural unit cells opposite to each other. As a result, the source electrode 6 and the gate electrode 5 are insulated and separated from each other with an interlayer dielectric 8 in between.

Descriptions will be provided next for an example of a method of manufacturing the semiconductor device shown in FIG. 1 by referring to FIGS. 2A to 3B.

Figure 2A:
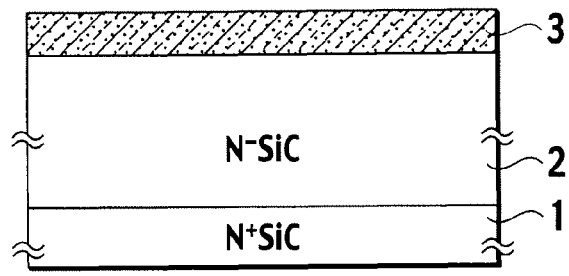
FIGS. 2A to 2C are cross-sectional views showing chief manufacturing steps in a method of manufacturing the semiconductor device as shown in FIG. 1.

(1) First of all, the $N^-$ type silicon carbide semiconductor substrate obtained by epitaxially growing the $N^-$ type drift region 2 on the $N^+$ type substrate region 1 as shown in FIG. 2A is prepared. Subsequently, a polysilicon layer (first hetero semiconductor layer) is formed on the silicon carbide semiconductor substrate, for example, by low-pressure chemical vapor deposition (LP-CVD). The polysilicon layer is doped with phosphorus (P) or arsenic (As) as an impurity, for example, by ion implantation. Thereby, the N type polysilicon layer 3 is formed. It should be noted that the polysilicon layer 3 may be formed by depositing polysilicon through electron-beam evaporation or sputtering followed by re-crystallization through laser annealing or the like. In the case of the present invention, the first hetero semiconductor layer is not limited to the polysilicon layer 3. The first hetero semiconductor layer may be formed, for example, of single-crystal silicon heteroepitaxially grown by molecular beam epitaxy, instead of polysilicon. In addition, the doping is not limited to ion implantation. Solid phase diffusion or gas phase diffusion may be used for the doping.

Figure 2B:
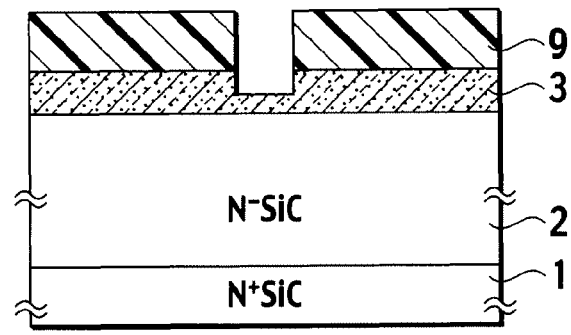

(2) Subsequently, a mask material 9 with an opening in a predetermined area is formed on the polysilicon layer 3, for example, by photolithography, as shown in FIG. 2B. A photoresist may be used as a material for the mask material 9. However, another material such as a silicon dioxide film ($SiO_2$ film) or a silicon nitride (SiN film) may be used as a material for the mask material 9. Afterward, a part of the polysilicon layer 3 which is exposed to the outside through the opening of the mask material 9 is selectively removed, for example, by dry etching such as reactive ion etching. At this time, some of the part of the polysilicon layer 3 which is exposed to the outside through the opening of the mask material 9 is removed with the rest of the polysilicon layer 3 left in a predetermined film thickness. In other words, the etching step is completed when the polysilicon layer 3 comes to have the predetermined film thickness. The film thickness with which the polysilicon layer 3 should be left under the opening of the mask material 9 can be determined depending on the thickness of the gate insulating film which is going to be formed in the below-described thermal oxidation step.

Figure 2C:
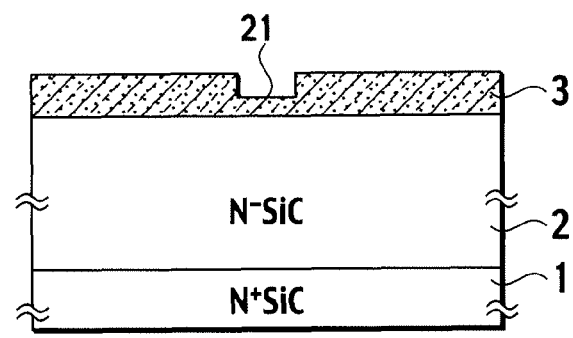

(3) Thereafter, the remaining mask material is removed after the etching, as shown in FIG. 2C. Through the foregoing manufacturing steps, the hetero semiconductor region 3 is formed on the semiconductor substrate (1, 2). A part (corresponding to the opening of the mask material 9) of the hetero semiconductor region 3a includes a film thickness control portion 21 whose film thickness is thinner than that of any other portion of the hetero semiconductor region 3a.

Figure 3A:
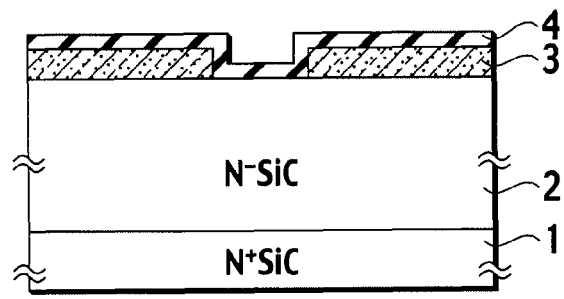
FIGS. 3A and 3B are cross-sectional views showing chief manufacturing steps in the method of manufacturing the semiconductor device as shown in FIG. 1, which follows FIG. 2C.

(4) Subsequently, a surface layer portion of the hetero semiconductor region 3 is oxidized, for example, by dry $O_2$ oxidation at 900° C., as shown in FIG. 3A. Thereby, the hetero semiconductor region 3 is oxidized with a thickness equal to the film thickness of the film thickness control portion 21. As a result, the film thickness control portion 21 shown in FIG. 2C is all oxidized. Concurrently, only the exposed portion of the hetero semiconductor region 3 is oxidized except for the film thickness control portion 21. In this manner, the gate insulating film 4 adjacent to the heterojunction between the hetero semiconductor region 3 and the drift region 2 is formed. By oxidizing the whole of the part (film thickness control portion 21) left in the predetermined film thickness through etching the hetero semiconductor region 3 by dry etching as shown in FIG. 2B, the hetero semiconductor region 3 and the gate insulating film 4 are simultaneously formed. It should be noted that, although dry $O_2$ oxidation has been cited as an example of the oxidation method in this respect, wet oxidation or pyrogenic oxidation may be used as the oxidation method. Otherwise, plasma oxidation may be used as the oxidation method. In addition, any other temperature may be used as the temperature condition as long as the temperature is not higher than a temperature at which the hetero semiconductor region 3 is melt.

Figure 3B:
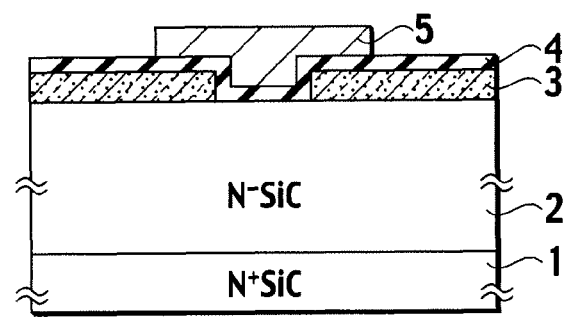

(5) As the gate electrode 5, a polysilicon layer is then deposited on the gate insulating film 4, for example, by LP-CVD, as shown in FIG. 3B. Subsequently, the polysilicon layer is doped with phosphorus or arsenic as an impurity, for example, by ion implantation. It should be noted that solid phase diffusion or gas phase diffusion may be used for the doping. Subsequently, a predetermined mask material is formed on the polysilicon layer, for example, by photolithography. Afterward, the polysilicon layer is selectively etched by dry etching, and thereby the gate electrode 5 is patterned. At this time, a different material such as a $SiO_2$ film or a SiN film, which is other than the resist material, may be used as the mask material. In this manner, the N-type gate electrode 5 is formed on the gate insulating film 4.

(6) Finally, the interlayer dielectric 8 is formed, for example, by CVD. In addition, the drain electrode 7 made, for example, of titanium (Ti) and nickel (Ni) is formed on the back of the substrate region 1. Subsequently, a predetermined contact hole to which the hetero semiconductor region 3 is exposed to the outside is formed. Thereafter, the source electrode 6 made, for example, of titanium (Ti) and aluminum (Al) is embedded into the contact hole. Through the foregoing manufacturing steps, the semiconductor device as shown in FIG. 1 is completed.

As described above, the portion of the gate insulating film 4 which is formed above the drift region 2 and the portion of the hetero semiconductor region 3 which is formed in the vicinity of the heterojunction are both formed by thermally oxidizing polysilicon which is the material for the hetero semiconductor region 3, in FIG. 3A. This makes it possible to obtain the two portions each with a substantially uniform film thickness. Thus, the use of the manufacturing method according to the present embodiment makes it possible to obtain the gate insulating film 4 with the uniform film thickness, and with a higher insulating characteristic and a higher reliability both resulting from the thermal oxidation.

Subsequently, descriptions will be provided next for operations of the semiconductor device shown in FIG. 1. In the case of the present embodiment, for example, the semiconductor device is used with the source electrode 6 grounded, and with a positive electric potential applied to the drain electrode 7.

First of all, in a case where, for example, a ground electric potential or a negative electric potential is applied to the gate electrode 5, the source electrode 6 and the drain electrode 7 are kept cut off from each other. This is because the energy barrier against conduction electrons is formed in the heterojunction interface between the hetero semiconductor region 3 and the drift region 2. At this time, the gate insulating film 4 adjacent to the heterojunction interface has the uniform film thickness, and can be formed by thermal oxidation, in the case of the present embodiment. This makes it possible for the gate insulating film 4 to keep the higher insulating characteristic and the higher reliability even if the gate insulating film 4 is exposed to a predetermined drain electric field.

Subsequently, in a case where a positive potential is applied to the gate electrode 5 in order that the cutoff condition between the source electrode 6 and the drain electrode 7 can be turned to a conduction condition therebetween, an electron accumulating layer is formed in the hetero semiconductor region 3 and the surface layer portion of the drift region 2 which a gate electric field reaches through the gate insulating film 4. This causes the hetero semiconductor region 3 and the surface layer portion of the drift region 2 to have a potential in which free electrons can be present. As a result, the energy barrier which has extended to the drift region 2 becomes steep, and only the thickness of the energy barrier becomes small. As a result, an electric current of electrons are conducted between the source electrode 6 and the drain electrode 7.

At this time, it is hard to cut off the gate electric field extending from the gate electrode 5 by an interface state and the like, because the gate insulating film 4 is uniform in film thickness and homogeneous in the case of the present embodiment. This makes it possible to make the energy barrier of the hetero barrier steeper. In other word, the electric current is capable of being conducted between the source electrode 6 and the drain electrode 7 with a lower ON resistance.

Subsequently, when the ground electric potential is applied to the gate electrode 5 again in order that the conduction condition between the source electrode 6 and the drain electrode 7 is turned to the cutoff condition therebetween, the conduction electron accumulating condition which has been formed in the heterojunction interface between the hetero semiconductor region 3 and the drift region 2 is released. As a result, the tunneling in the energy barrier is stopped. Subsequently, the flow of conduction electrons is stopped from the hetero semiconductor region 3 to the drift region 2. Furthermore, conduction electrons which are present in the drift region 2 flow to the substrate region 1, and are accordingly depleted in the drift region 2. Thereby, a depletion layer extends from the heterojunction portion to the drift region 2. Thus, the source electrode 6 and the drain electrode 7 are turned into the cutoff condition again.

Moreover, in the case of the present embodiment, conduction in the reverse direction (a reflux operation) is also capable of being carried out, for example, by grounding the source electrode 6 and concurrently applying the negative electric potential to the drain electrode 7. If, for example, a ground electric potential is applied to the source electrode 6 and the gate electrode 5 whereas a predetermined positive electric potential is applied to the drain electrode 7, the energy barrier against conduction electrons disappears. Thus, conduction electrons flow from the drift region 2 to the hetero semiconductor region 3. As a result, the conduction in the reverse direction is realized. At this time, no positive hole is injected, and the current is conducted only by conduction electrons between the source electrode 6 and the drain electrode 7. For this reason, loss which occurs due to a reverse recovery current is small when the reverse conduction condition is turned to the cutoff conduction. It should be noted that this is capable of being realized in a case where the gate electrode 5 is used as a control electrode while not grounded.

As described above, the first embodiment of the present invention makes it possible to obtain the following operations and effects.

A part of the hetero semiconductor region 3 including the film thickness control portion 21 whose thickness is thinner than any other portion of the hetero semiconductor region 3 is formed on the semiconductor substrate. Thereafter, the hetero semiconductor region 3 is oxidized with a thickness equal to the film thickness of the film thickness control portion 21, and thereby the gate insulating film 4 is formed. The gate insulating film 4 is formed by thermally oxidizing polysilicon which is the material for the hetero semiconductor region 3. This makes it possible to obtain the gate insulating film 4 with the substantially uniform film thickness. As a result, this makes it possible to obtain the gate insulating film with the uniform film thickness and with the higher insulating characteristic and the higher reliability both resulting from the thermal oxidation.

As shown in FIG. 2A, the polysilicon layer (first hetero semiconductor layer) made of the hetero semiconductor material is formed on the semiconductor substrate. As shown in FIG. 2B, a part of the polysilicon layer is selectively removed with the rest of the part of the polysilicon layer 3 left with a thickness equal to the film thickness of the film thickness control portion 21. This makes it possible to easily form the film thickness control portion 21 only by controlling a time needed for etching the polysilicon layer, and without increasing manufacturing steps in number.

(First Modification)

In the case of the manufacturing method shown in FIGS. 2A to 3B, a part of the first hetero semiconductor layer 3 which is exposed to the outside through the opening of the mask material 9 is etched to the predetermined thickness by dry etching to form the film thickness control portion 21. Instead, the film thickness control portion 21 may be formed by use of manufacturing methods each shown in FIGS. 3 to 5.

Figure 4A:
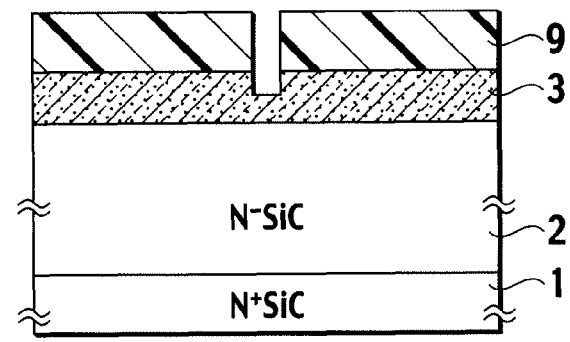
FIGS. 4A to 4C are cross-sectional views showing chief manufacturing steps in a method of manufacturing a semiconductor device according to a first modification.

(1) A polysilicon layer 3 (first hetero semiconductor layer) is formed on a semiconductor substrate in the same manner as shown in FIG. 2A. Thereafter, a mask material 9 having a predetermined opening is formed on the first hetero semiconductor layer 3, for example, by photolithography, as shown in FIG. 4A. The opening of the mask material 9 is narrower than the opening shown in FIG. 2B.

(2) Subsequently, the part of the first hetero semiconductor layer 3 which is exposed to the outside through the opening of the mask material 9 is etched, for example, by reactive ion etching. At this time, as shown in FIG. 4A, the etching step is completed when the first hetero semiconductor layer 3 comes to have a film thickness thicker than that illustrated in FIG. 2B. In other words, the film thickness of the unremoved part of the first hetero semiconductor layer 3 which is exposed to the opening of the mask material 9, and which should be left unetched, is thicker than that illustrated in FIG. 2B.

Figure 4B:
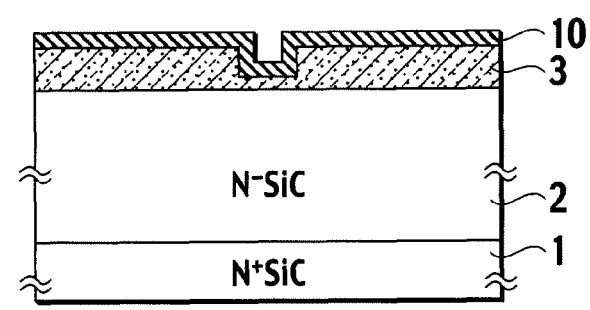

(3) A surface layer portion of the first hetero semiconductor layer 3 is oxidized, for example, by dry $O_2$ oxidation at 900° C. Thereby, a sacrifice oxide film 10 is formed in the surface layer portion of the first hetero semiconductor layer 3, as shown in FIG. 4B. The film thickness of the sacrifice oxide film 10 is controlled in order that the film thickness of the first hetero semiconductor layer 3 to be left under the sacrifice oxide film 10 should be equal to the film thickness of the film thickness control portion 21 in the opening portion of the mask material 9. It should be noted that, although dry $O_2$ oxidation is adopted as an example of sacrifice oxidation, wet oxidation and pyrogenic oxidation may be adopted. Otherwise, plasma oxidation may be adopted. In addition, any other temperature may be used as the temperature condition as long as the temperature is not higher than a temperature at which the first hetero semiconductor layer 3 is melt.

Figure 4C:
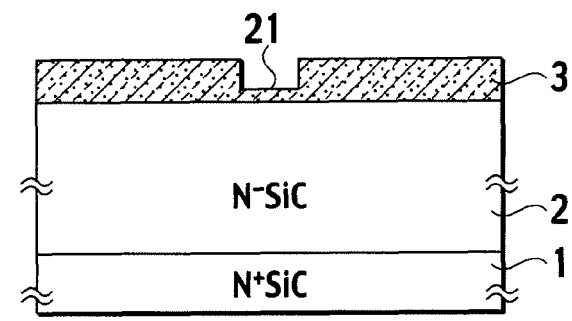

(4) Subsequently, the sacrifice oxide film 10 formed as shown in FIG. 4B is removed, for example, by wet etching using a solution obtained by mixing ammonium fluoride and hydrofluoric acid, as shown in FIG. 4C. The first hetero semiconductor layer 3 which has been left after the removal of the sacrifice oxide film 10 is formed as a hetero semiconductor region 3 including the film thickness control portion 21 with a predetermined film thickness in the same manner as shown in FIG. 2C. Thereafter, steps which is the same as the manufacturing method shown in FIG. 3A and the ensuing figures are carried out. This makes it possible to complete a semiconductor device as shown in FIG. 1.

As described above, the hetero semiconductor region 3 having the same form as the hetero semiconductor region 3 shown in FIG. 2C is formed by combining anisotropic dry etching and isotropic wet etching, as shown in FIG. 4C. Thereby, the part of the first hetero semiconductor layer 3 whose crystal structure has become irregular due to the dry etching is capable of being removed by the wet etching. After the etching damage which has occurred due to the dry etching is removed, the gate insulating film 4 is formed by thermally oxidizing the hetero semiconductor region 3. This makes it possible to further decrease the interface state of the gate insulating film 4 formed by thermal oxidation, and to accordingly form the gate insulating film 4 with a high quality.

Although the foregoing descriptions have been provided for the case where the hetero semiconductor region 3 is formed by the dry etching, the formation of the sacrifice oxide film 10 by thermal oxidation, and the wet etching of the oxide film in combination. However, it should be noted that the hetero semiconductor region 3 shown in FIG. 4C may be formed by wet etching through the opening of the mask material 9 instead of the dry etching shown in FIG. 4A. Otherwise, another etching method may be used. In any case, these etching methods may be carried out no matter how combined. In addition, the step of removing the etching damage may be carried out by selectively forming the sacrifice oxide film 10 while leaving the mask material 9 depending on a material for the mask material 9, although FIG. 4B shows that the sacrifice oxide film 10 is formed after the mask material 9 is removed.

(Second Modification)

As for the first embodiment and the first modification, the descriptions have been provided for the method of controlling the film thickness of the film thickness control portion 21 by controlling the time needed for etching the first hetero semiconductor layer 3. However, the present invention is not limited to this method. As described below, the film thickness is capable of being controlled in film formatting steps.

Figure 5A:
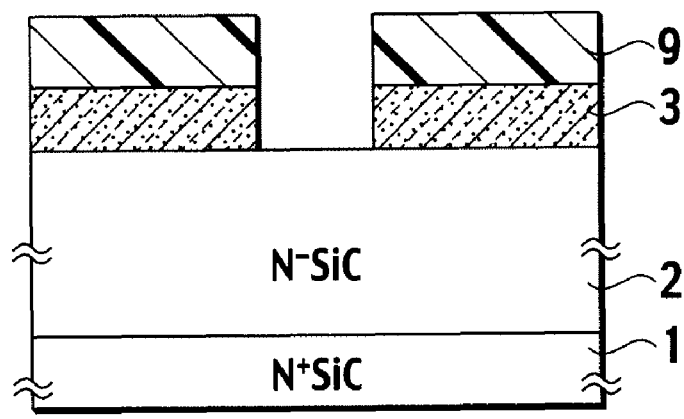
FIGS. 5A to 5C are cross-sectional views showing chief manufacturing steps in a method of manufacturing a semiconductor device according to a second modification.

(1) A polysilicon layer (first hetero semiconductor layer) is formed on a semiconductor substrate in the same manner as shown in FIG. 2A. Thereafter, a predetermined mask material 9 is formed on the first hetero semiconductor layer 3, as shown in FIG. 5A. It should be noted that an opening in the mask material 9 shown in FIG. 5A is shaped like the same form as that shown in FIG. 2B. Subsequently, a part of the first hetero semiconductor layer 3 which is exposed to the outside through the opening of the mask material 9 is all etched. Thereby, a part of the semiconductor substrate (drift region 2) is exposed to the bottom of the opening of the mask material 9. It should be noted that, as for the etching method, the part of the first hetero semiconductor 3 may be etched by dry etching only. Otherwise, a combination of the formation of a sacrifice oxide film 10 by thermal oxidation with wet etching may be used for the etching method for the purpose of removing damage which occurs during dry etching, and which has been described in the first modification. In addition, the part of the first hetero semiconductor 3 may be etched by wet etching instead of dry etching. Otherwise, another etching method may be used. In any case, these etching methods may be carried out no matter how combined.

Figure 5B:
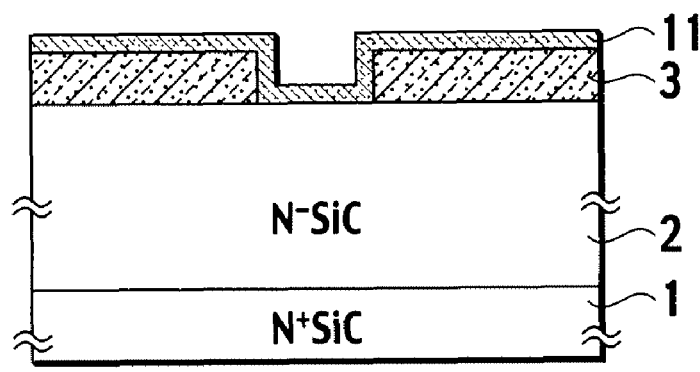

(2) After the mask material 9 is removed, a second hetero semiconductor layer 11 made of polysilicon is formed with a film thickness equal to the film thickness of the film thickness control portion 21, for example, by LP-CVD as shown in FIG. 5B. The first hetero semiconductor layer 3 and the second hetero semiconductor layer 11 are formed as the hetero semiconductor region 3 including the film thickness control portion 21 with the predetermined film thickness shown in FIG. 2C. The second hetero semiconductor layer 11 may be formed by depositing polysilicon through electron-beam evaporation or sputtering followed by re-crystallization through laser annealing or the like. Otherwise, the second hetero semiconductor layer 11 may be formed, for example, of single-crystal silicon heteroepitaxially grown by molecular beam epitaxy. Alternately, the second hetero semiconductor layer 11 may be formed of amorphous silicon. In addition, the second hetero semiconductor layer 11 does not have to be doped with an impurity. The second hetero semiconductor layer 11 is formed with a substantially uniform thickness on the part of the drift region 2 which is exposed to the bottom of the opening portion of the mask material 9, and on the top and the opening side surfaces of the first hetero semiconductor layer 3.

Figure 5C:
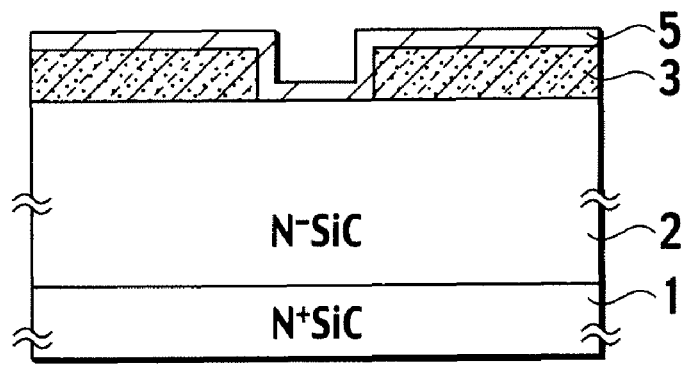

(3) Subsequently, the second hetero semiconductor layer 11 is thermally oxidized, for example, by dry $O_2$ oxidation at 900° C. as shown in FIG. 5C. In the case of the second modification, the second hetero semiconductor layer 11 is all oxidized. For this reason, the hetero semiconductor region 3 and the gate insulating film 4 are capable of being simultaneously formed. A part of the gate insulating film 4 which is formed on the drift region 2 and another part of the gate insulating film 4 which is formed in a vicinity of the heterojunction between the hetero semiconductor region 3 and the drift region 2 are both formed by thermally oxidizing the second hetero semiconductor layer 11 made of polysilicon. This makes it possible to obtain the substantially uniform film thickness in the vicinity of the heterojunction. It should be noted that a portion of the first hetero semiconductor layer 3 may be thermally oxidized while the second hetero semiconductor layer 11 is thermally oxidized. After this, manufacturing steps which are the same as those shown in FIG. 3B and the ensuing figures are carried out. This makes it possible to complete a semiconductor device as shown in FIG. 1.

As described above, the gate insulating film 4 is formed by thermally oxidizing the whole of the second hetero semiconductor layer 11. Thereby, the hetero semiconductor layer 11 to be thermally oxidized is capable of being formed by controlling the thickness of the hetero semiconductor 11 very well. This makes it possible to obtain the gate insulating film 4 with a further uniform film thickness, and with a higher insulating characteristic and a higher reliability both resulting from the thermal oxidation. FIG. 5A shows the case where the portion of the first hetero semiconductor layer 3 which is exposed to the outside through the opening of the mask material 9 is all etched out. However, it should be noted that the first hetero semiconductor layer 3 is left unetched with a predetermined thickness, and the second hetero semiconductor layer 11 may be formed on the resultant first hetero semiconductor layer 3.

(Third Modification)

FIG. 5A shows the case where only a part of the first hetero semiconductor layer 3 which is exposed to the outside through the opening is etched. However, even the drift region 2 under the first hetero semiconductor layer 3 may be additionally etched as shown in FIGS. 6A to 6C.

Figure 6A:
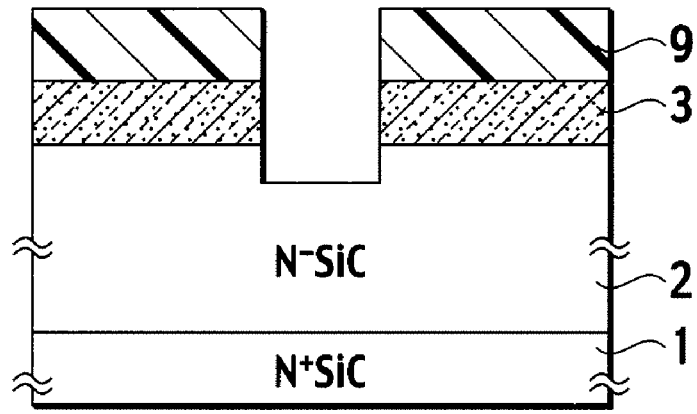
FIGS. 6A to 6C are cross-sectional views showing chief manufacturing steps in a method of manufacturing a semiconductor device according to a third modification.

(1) As shown in FIG. 6A, a mask material 9 including an opening shaped like the same form as the opening shown in FIG. 2B is formed on the first hetero semiconductor layer 3. Subsequently, the part of the first hetero semiconductor layer 3 which is exposed to the outside through the opening of the mask material 9 is all etched out. Thereby, the semiconductor substrate (drift region 2) is exposed to the bottom of the opening of the mask material 9. Thereafter, a part of the drift region 2 which is exposed to the bottom of the opening is selectively removed by use of the same mask material 9. As for the etching method, the part of the first hetero semiconductor 3 may be etched by dry etching only. Otherwise, a combination of the formation of a sacrifice oxide film 10 by thermal oxidation with the wet etching of the oxide film may be used for the etching method for the purpose of removing damage during the dry etching, and which has been described in the first modification.

Figure 6B:
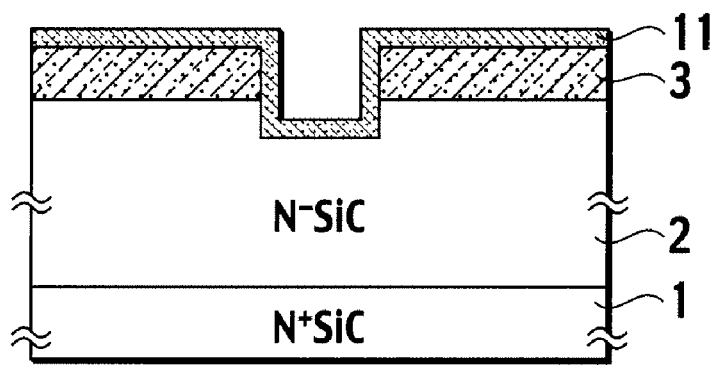

(2) As shown in FIG. 6B, a second hetero semiconductor layer 11 made of polysilicon is thereafter formed, for example, by LP-CVD in the same manner as the second modification.

Figure 6C:
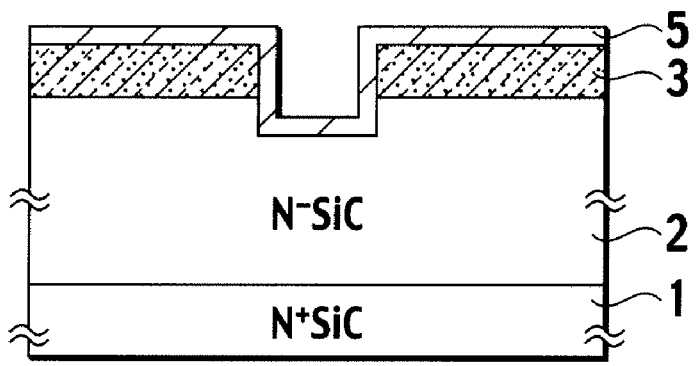
Figure 7:
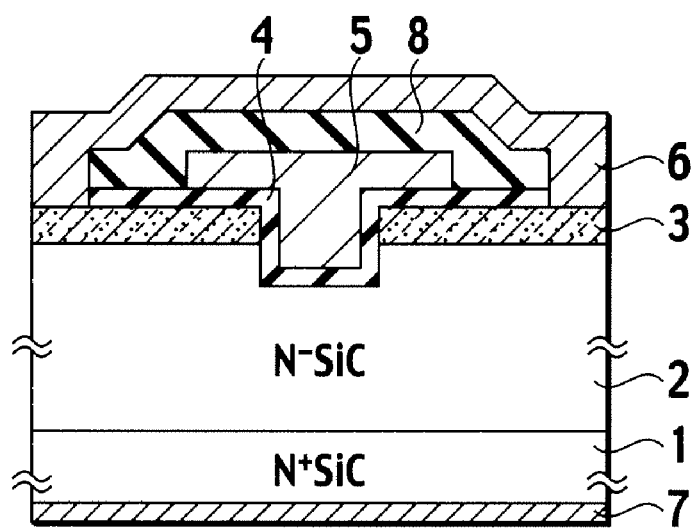
FIG. 7 is a cross-sectional view showing a chief manufacturing step in the method of manufacturing a semiconductor device according to the third modification, which follows FIG. 6C.

(3) Subsequently, the second hetero semiconductor layer 11 is thermally oxidized, for example, by dry $O_2$ oxidation at 900° C. as shown in FIG. 6C. The second hetero semiconductor layer 11 is all oxidized in common with the second modification. Thereafter, manufacturing steps which are the same as those shown in FIG. 3B and the ensuing figures are carried out. This makes it possible to complete a semiconductor device including a part of the gate insulating film 4 and a part of the gate electrode 5 which reach the inside of the drift region 2 as shown in FIG. 7.

Even in a case where the part of the drift region 2 is etched as shown in FIG. 6A, the thickness of the second hetero semiconductor layer 11 to be thermally oxidized is capable of being controlled with a very high precision. This makes it possible to obtain the gate insulating film 4 with a uniform film thickness and with a higher insulating characteristic and a higher reliability both resulting from the thermal oxidation.

In any case of the first embodiment and its modifications (the first to third modifications), the gate insulating film 4 is formed by oxidizing a portion or all of any one of the first hetero semiconductor layer 3 and the second hetero semiconductor layer 11 which are made of their respective hetero semiconductor materials (polysilicon). This makes it possible to obtain the gate insulating film 4 with a uniform film thickness and with a higher insulating characteristic and a higher reliability both resulting from the thermal oxidation. It should be noted that the gate insulting film 4 may have a laminated structure which is obtained by superposing CVD oxide films formed, for example, by CVD as long as an oxide film formed in a way that the oxide film contacts the heterojunction interface between the drift region 2 and the hetero semiconductor region 3 is included. In this case, it does not matter in what sequence the CVD oxide films are superposed on one another. A thermal oxide film may be formed after the CVD oxide films are superposed on one another. This makes it possible to anneal the CVD oxide films at the same time as the thermal oxide film is formed. In any case, a step of annealing the CVD oxide films at a predetermined temperature in a predetermined atmosphere may be carried out after the gate insulating film 4 is formed.

Second Embodiment

Figure 8:
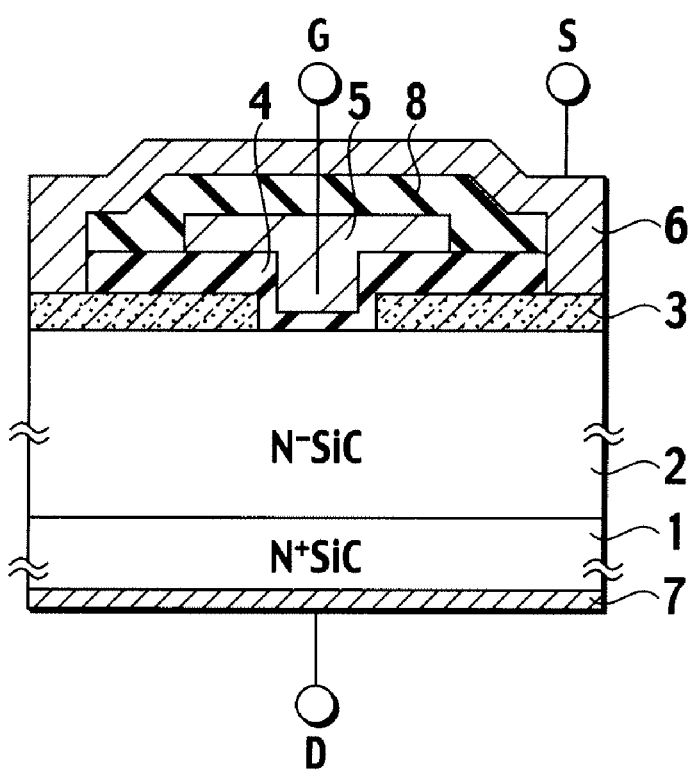
FIG. 8 is a cross-sectional view of a configuration of a semiconductor device according to a second embodiment of the present invention.

Descriptions will be provided for a configuration of a semiconductor device according to a second embodiment of the present invention by referring to FIG. 8. It should be noted that the descriptions will be provided only for what make the semiconductor device according to the second embodiment different from the semiconductor device shown in FIG. 1.

As shown in FIG. 8, a part of a gate insulating film 4 placed on a hetero semiconductor region 3, which is other than a driving part of the switch, is formed with a film thickness thicker than that of a vicinity of the driving part (vicinity of the heterojunction) while the other part of the gate insulating film 4 in a vicinity of the heterojunction between the hetero semiconductor region 3 and a drift region 2, which is equivalent to the driving part of the switch, is formed with a thickness equal to that of the corresponding part of the gate insulating film 4 shown in FIG. 1. The other point is common with FIG. 1. For this reason, descriptions for this point will be omitted.

By forming the part of the gate insulating film 4 placed on the hetero semiconductor region 3 with the thickness thicker than that of the vicinity of the heterojunction, the insulating characteristic of the insulation between a gate electrode 5 and the hetero semiconductor region 3 becomes far higher while in the cutoff condition. In addition, a long-term reliability is improved because a leakage current is suppressed.

Figure 9A:
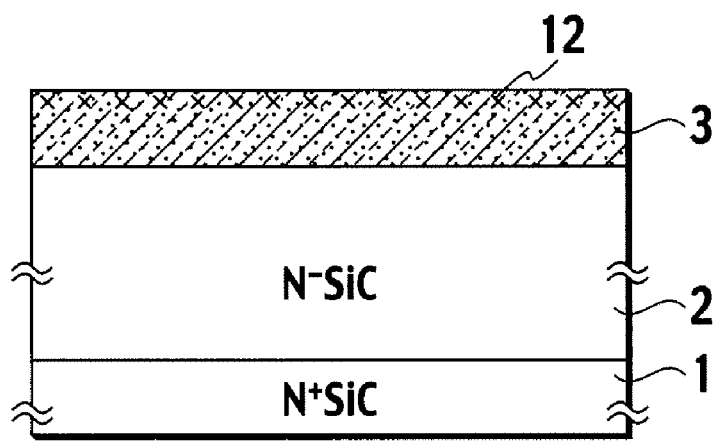
FIGS. 9A to 9C are cross-sectional views showing chief manufacturing steps in a method of manufacturing the semiconductor device as shown in FIG. 8.
Figure 9B:
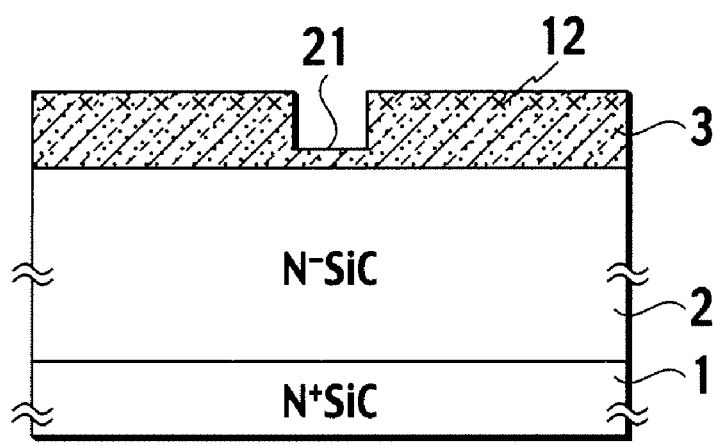
Figure 9C:
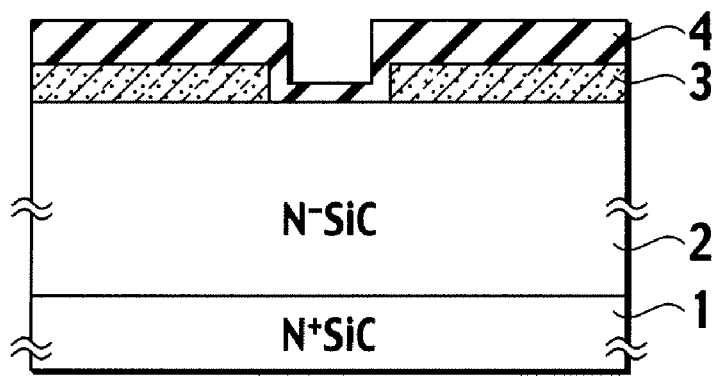

Descriptions will be provided next for an example of a method of manufacturing the semiconductor device shown in FIG. 8 by referring to FIGS. 9A to 9C.

(1) First of all, an N type silicon carbide semiconductor substrate obtained by epitaxially growing an N⁻ type drift region 2 on an N⁺ type substrate region 1 is prepared as shown in FIG. 9A. Subsequently, a polysilicon layer 3 (first hetero semiconductor layer) is formed on the silicon carbide semiconductor substrate, for example, by LP-CVD. Thereafter, the first hetero semiconductor layer 3 is doped with an impurity such as phosphorus or arsenic, for example, by ion implantation. At this time, an ion-implantation damage layer 12 whose crystal structure has become irregular due to the ion implantation is formed in a surface layer portion of the first hetero semiconductor layer 3. In the case of the second embodiment, the ion-implantation damage layer 12 is left unremoved. In general, when ions are implanted into a silicon layer, its crystals are broken by the ion implantation damage. The crystals are recovered through re-crystallization by applying a predetermined thermal process to the crystals. The second embodiment causes the ion-implantation damage layer 12 to exist, as it is, in the surface layer portion of the first hetero semiconductor layer 3. It should be noted that the first hetero semiconductor layer 3 may be formed by depositing it through electron-beam evaporation or sputtering, followed by re-crystallization through laser annealing. Otherwise, the first hetero semiconductor layer 3 may be formed of single-crystal silicon obtained through hetero-epitaxial growth, for example, by molecular beam epitaxy.

(2) Subsequently, a mask material 9 with an opening in a predetermined area thereof is formed on the first hetero semiconductor layer 3 in the same manner as shown in FIGS. 2B and 2C. Thereafter, a part of the first hetero semiconductor layer 3 which is exposed to the outside through the opening of the mask material 9 is selectively removed by dry etching. At this time, the part of the first hetero semiconductor layer 3 which is exposed to the outside through the opening of the mask material 9 is removed while a part of the first hetero semiconductor layer 3 is left unetched with a predetermined thickness. After the etching, the mask material 9 is removed. Through the foregoing steps, the hetero semiconductor region 3 is formed on the semiconductor substrate (1, 2), as shown in FIG. 9B. A part (corresponding to the opening of the mask material) of the hetero semiconductor region 3 includes a film thickness control portion 21 whose film thickness is thinner than that of any other portion. In addition, the ion-implantation damage layer 12 is formed in the hetero semiconductor region 3 except for the film thickness control portion 21.

(3) Thereafter, a surface layer portion of the hetero semiconductor region 3 is oxidized, for example, by dry $O_2$ oxidation at 900° C., as shown in FIG. 9C. Thereby, the hetero semiconductor region 3 is oxidized with a thickness equal to the film thickness of the film thickness control portion 21. As a result, the film thickness control portion 21 shown in FIG. 9B is all oxidized. Simultaneously, only the exposed portion of the hetero semiconductor region 3, except for the part corresponding to the film thickness control portion 21, is partially oxidized. In this manner, a gate insulating film 4 adjacent to a heterojunction between the hetero semiconductor region 3 and the drift region 2 is formed. The hetero semiconductor region 3 thus oxidized includes an ion-implantation damage layer 12. The oxidation rate of the ion-implantation damage layer 12 is higher than that of the other portion of the hetero semiconductor region 3. This makes it possible to obtain a thicker oxide film than otherwise even though the same length of time is spent for the thermal oxidation. After this, manufacturing steps which are the same as those shown in FIG. 3B and the ensuing figures are carried out. This makes it possible to complete a semiconductor device shown in FIG. 8.

As described above, the ion-implantation damage layer 12 exists on the upper layer portion of a part of the hetero semiconductor region 3 which does not affect the drive of the switch. For this reason, the part of the hetero semiconductor region 3 has a higher oxidation rate than the other area of the hetero semiconductor region 3. This makes it possible to obtain an oxide film which is thicker than a part of the gate insulating film 4 in a vicinity of the heterojunction. Thereby, the gate insulating characteristic of a part other than the driving part is further improved. This makes it possible to obtain a higher reliability.

(Fourth Modification)

Figure 10A:
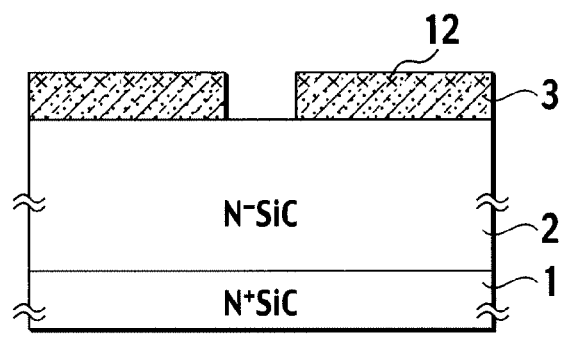
FIGS. 10A to 10C are cross-sectional views showing chief manufacturing steps in a method of manufacturing a semiconductor device according to a fourth modification.
Figure 10B:
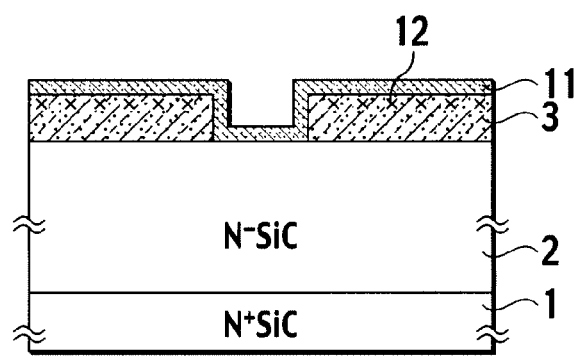
Figure 10C:
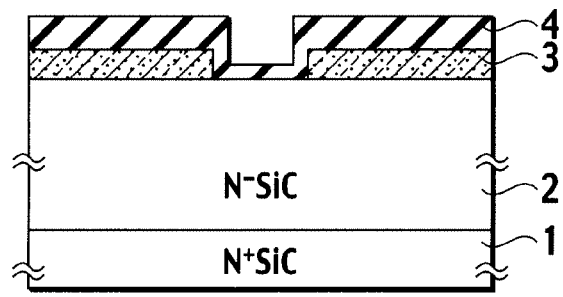

The semiconductor device shown in FIG. 8 is capable of being manufactured by use of a manufacturing method shown in FIGS. 10A to 10C. Specifically, the hetero semiconductor region 3 may be formed by forming a second hetero semiconductor layer 11 on the first hetero semiconductor layer 3.

(1) In common with the second embodiment, the first hetero semiconductor layer 3 is formed on an N type silicon carbide semiconductor substrate. Subsequently, ions of an impurity are implanted into the first hetero semiconductor layer 3. At this time, an ion-implantation damage layer 12 is formed in a surface layer portion of the first hetero semiconductor layer 3.

(2) As shown in FIG. 10A, a part of the polysilicon layer 3 which is exposed to the outside through an opening of a mask material is selectively removed by dry etching. At this time, the part of the polysilicon layer 3 which is exposed to the outside through the opening of the mask material 9 is all removed, and thereby a part of the drift region 2 is exposed to the bottom of the opening. After the etching, the mask material is removed. It should be noted that the dry etching may be carried out in a way that a part of the drift region 2 is etched out.

(3) As shown in FIG. 10B, a second hetero semiconductor layer 11 made of polysilicon is formed with a thickness equal to a film thickness portion 21, for example, by LP-CVD. The first hetero semiconductor layer 3 and the second hetero semiconductor layer 11 form a hetero semiconductor region 3 including the film thickness control portion 21 with a predetermined film thickness. The second hetero semiconductor layer 11 is formed with a substantially uniform thickness on the part of the drift region 2 which is exposed to the bottom of the opening of the mask material 9, and on the top and the opening side wall of the first hetero semiconductor layer 3.

(4) Subsequently, the hetero semiconductor layer 3 is thermally oxidized with a thickness equal to the film thickness of the second hetero semiconductor layer 11 (film thickness control portion 21), for example, by dry $O_2$ oxidation at 900° C. as shown in FIG. 10C. At this time, the ion-implantation damage layer 12 is oxidized as well immediately after the second hetero semiconductor layer 11 is oxidized. The oxidation rate of the ion-implantation damage layer 12 is higher than that of the other part of the hetero semiconductor region 3. This makes it possible to obtain a thicker oxide film even though the same thermal oxidation is performed. After this, manufacturing steps which are the same as those shown in FIG. 3B and the ensuing figures are carried out. This makes it possible to complete a semiconductor device shown in FIG. 8.

By controlling the type of an impurity with which the hetero semiconductor region 3 or the hetero semiconductor layer 11 is doped, the impurity concentration, the doping position and the like, a threshold value of the gate electrode is capable of being controlled, although a conventional method using a CVD oxide film has been unable to control the threshold value. This is effective for controlling the cutoff characteristic of the semiconductor device.

Other Embodiments

The present invention has been described citing the first and second embodiments and their modifications as discussed above. It shall not be understood that the descriptions and the drawings which constitute a part of this disclosure imposes a limitation of the present invention. From this disclosure, various alternative embodiments, examples and applied technologies will be clear to those skilled in the art.

For example, the first and second embodiments have been described citing the example of the transistors each including a basis structure. However, as long as a method of manufacturing a gate insulating film 4 near a heterojunction is common with the foregoing manufacturing methods, the same effect is capable of being obtained, no matter what structure may be added thereto as a semiconductor device, or no matter how the structure may be modified. Specific examples of the configuration of the device will be shown in FIGS. 11 to 15.

Figure 11:
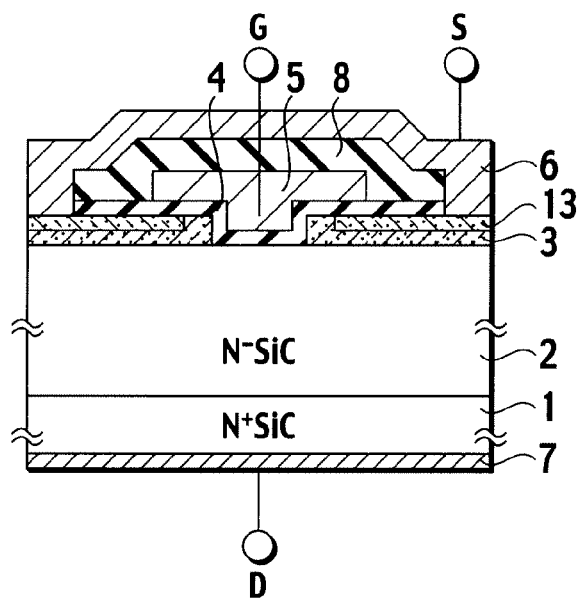
FIG. 11 is a cross-sectional view showing a configuration of a semiconductor device in which a second hetero semiconductor region is formed, which constitutes a first another embodiment.
Figure 12:
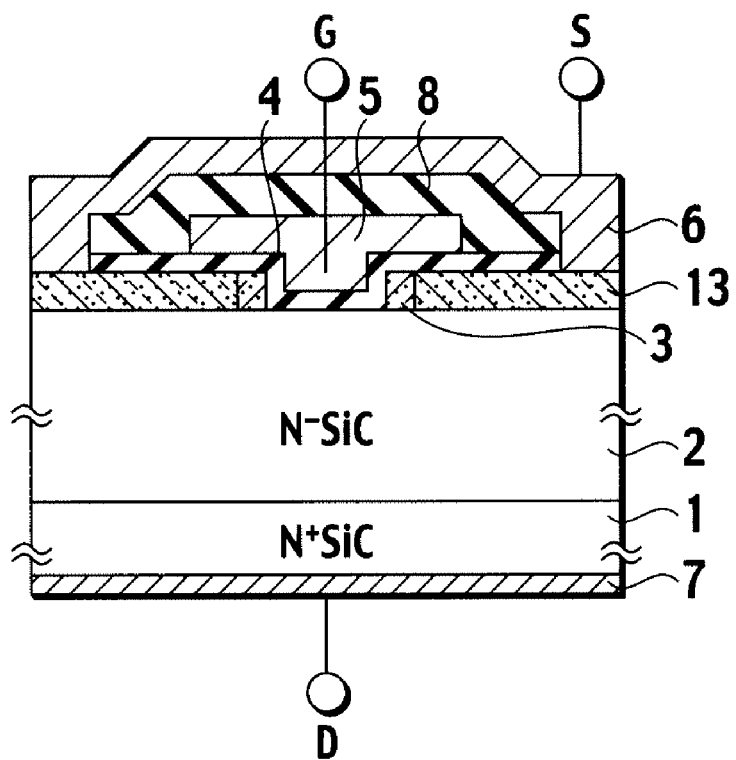
FIG. 12 a cross-sectional view showing a configuration of a semiconductor device in which the second hetero semiconductor region is formed, which constitutes a second another embodiment.

Each of the semiconductor devices respectively shown in FIGS. 1 and 8 is configured by including one hetero semiconductor region 3 which is of N type. As shown in FIGS. 11 and 12, however, a semiconductor device may include a second hetero semiconductor region 13. The second hetero semiconductor region 13 shown in FIG. 11 is arranged on the top of the hetero semiconductor region 3, and is connected to the source electrode 6. The second semiconductor region 13 shown in FIG. 12 is arranged in an area except for a vicinity of the heterojunction adjacent to the gate insulating film 4, and is connected to the source electrode 6 and the drift region 2. It should be noted that the conduction type of the second hetero semiconductor region 13 and the impurity concentration may be set arbitrarily depending on how the second hetero semiconductor region 13 is intended to be used. It goes without saying that the semiconductor device may include three or more types of hetero semiconductor regions instead of the two types of hetero semiconductor regions shown in FIGS. 11 and 12.

Figure 13:
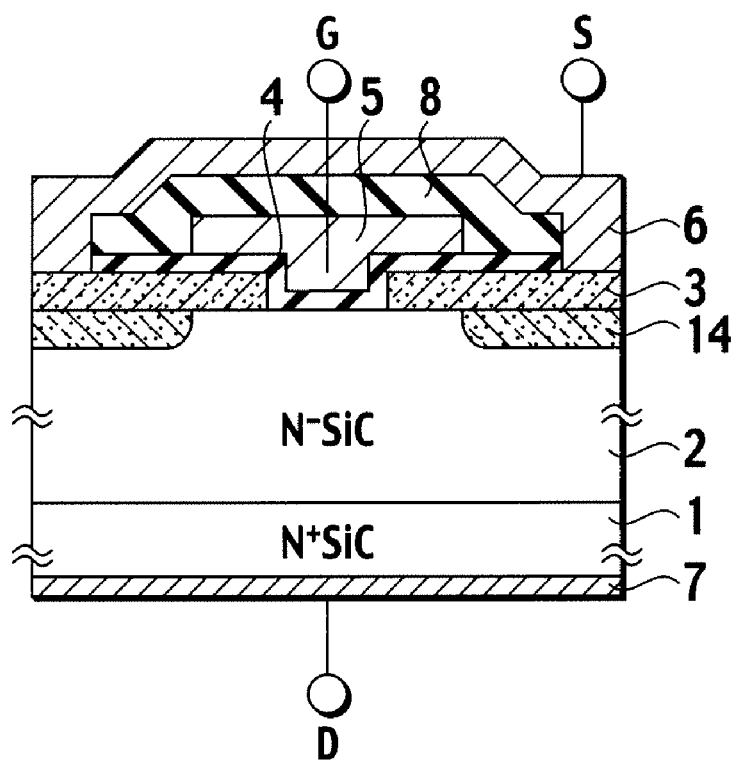
FIG. 13 is a cross-sectional view showing a configuration of a semiconductor device in which a first field limiting region is formed, which constitutes a third another embodiment.
Figure 14:
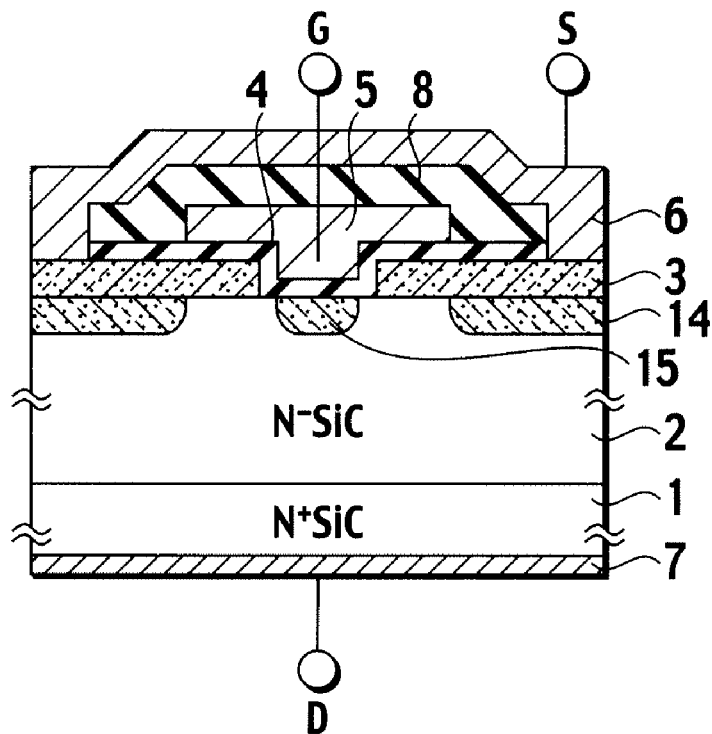
FIG. 14 is a cross-sectional view showing a configuration of a semiconductor device in which first and second field limiting regions are formed, which constitutes a fourth another embodiment.

In addition, a first field limiting region 14 and a second field limiting region 15 may be arranged in the drift region 2 as shown in FIGS. 13 and 14. By forming these field limiting regions, an electric field applied to the heterojunction interface between the hetero semiconductor region 3 and the drift region 2 is limited by the first field limiting region 14 while in the cutoff condition. This brings about an effect that the leakage current is reduced so that the cutoff performance is further improved. Moreover, the formation of the second field limiting region 15 as shown in FIG. 14 limits an electric field applied to the gate insulating film 4. This makes it less likely that a dielectric breakdown may occur in the gate insulating film 4, and accordingly improves the reliability. Each of the first field limiting region 14 and the second field limiting region 15 may be a P type region, a resistance region or an insulating region. Furthermore, the semiconductor device may be configured of only the second field limiting region 15 out of the two field limiting regions, although the second field limiting region 15 is formed together with the first field limiting region 14 in FIG. 14.

Figure 15:
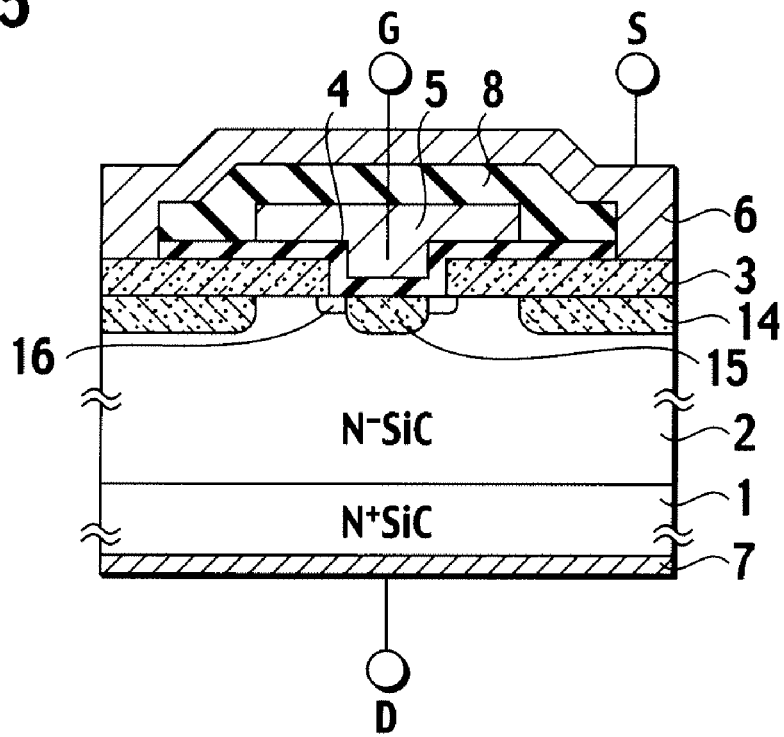
FIG. 15 is a cross-sectional view showing a configuration of a semiconductor device in which a first and second field limiting regions and a conducting region are formed, which constitutes a fifth another embodiment.

In addition, an $N^+$ type conduction region 16 with a higher $N^-$ type dopant concentration than that of the drift region 2 may be formed in a predetermined part in the drift region 2 where both the gate insulating film 4 and the hetero semiconductor region 3 contact the drift region 2 as shown in FIG. 15. In FIG. 15, the second field limiting region 15 and the first field limiting region 14 are formed in addition to the conduction region 16. However, it should be noted that only the conduction region 16 may be formed out of the three regions. Otherwise, the conduction region 16 may be formed together with any one of the second field limiting region 15 and the first field limiting region 14. Use of such a configuration makes it possible to limit the energy barrier in the heterojunction between the hetero semiconductor region 3 and the conduction region 16, and to accordingly obtain a higher conduction characteristic. In other words, the ON resistance becomes smaller, and the conduction performance is accordingly improved.

FIGS. 11 to 15 each shows the configuration of the gate insulating film 4 corresponding to FIG. 1. It goes without saying that a part of the gate insulating film 4 on the hetero semiconductor region 3, which part does not affect the drive of the switch, may be formed thicker than the other part of the gate insulating film 4 in order that the gate insulating film 4 can correspond to the gate insulating film 4 shown in FIG. 8. In addition, all of the embodiments have been described citing the example of the semiconductor device using silicon carbide as the substrate material. The substrate material may be any other semiconductor material such as silicon, silicon germanium, gallium nitride and diamond. Moreover, all of the embodiments have been described using 4H-polytype of silicon carbide. However, any other polytype of silicon carbide such as 6H-polytype of silicon carbide and 3C-polytype of silicon carbide may be used as the polytype of silicon carbide. Furthermore, all of the embodiments have been described citing what is termed as a transistor with a vertical structure, in which the drain electrode 7 and the source electrode 6 are arranged opposite to each other with the drift region 2 in between, and which flows the electric current in the vertical direction. However, what is termed as a transistor with a horizontal structure may be used, in which the drain electrode 7 and the source electrode 6 are arranged, for example, on a single main surface, and which flows the electric current in the horizontal direction.

In addition, some of the modifications have been described citing the example in which polysilicon is used as the material for the first hetero semiconductor layer 3 and the second hetero semiconductor layer 11. However, any other material such as any other silicon material, any other semiconductor material and any other polytype of silicon carbide may be used as long as the material forms a heterojunction with silicon carbide. Examples of the silicon material include single-crystal silicon and amorphous silicon. Examples of the semiconductor material include germanium and silicon germanium. Examples of the polytype of silicon carbide include a 6H-polytype silicon carbide and 3C-polytype of silicon carbide. All of the embodiments have been described citing the example in which N type silicon carbide is used as the drift region 2, and in which N type polysilicon is used as the hetero semiconductor region 3. However, any other combination such as a combination of N type silicon carbide with P type polysilicon, a combination of P type silicon carbide with P type polysilicon and a combination of P type silicon carbide with N type polysilicon may be used for the drift region 2 and the hetero semiconductor region 3.

The entire content of a Patent Application No. TOKUGAN 2006-186560 with a filing date of Jul. 6, 2006, is hereby incorporated by reference.

What is claimed is:

1. A method of manufacturing a semiconductor device, comprising the processes of:
    preparing a semiconductor substrate made of a semiconductor material;
    forming a hetero semiconductor region on the semiconductor substrate in order to form a heterojunction in an interface between the hetero semiconductor region and the semiconductor substrate, the hetero semiconductor region being made of a hetero semiconductor material having a bandgap which is different from that of the semiconductor material;
    forming at least a part of a gate insulating film adjacent to the heterojunction by oxidizing at least a part of the hetero semiconductor region; and
    forming a gate electrode on the gate insulating film,
    wherein a part of the hetero semiconductor region includes a film thickness control portion, whose film thickness is thinner than that of the other part of the hetero semiconductor region,
    the gate insulating film is formed by oxidizing the film thickness control portion,
    the process of forming the hetero semiconductor region on the semiconductor substrate includes the processes of:
    forming a first hetero semiconductor layer made of the hetero semiconductor material on the semiconductor substrate;
    selectively removing a part of the first hetero semiconductor layer so as to expose a part of the semiconductor substrate; and
    forming a second hetero semiconductor layer made of the hetero semiconductor material on at least the exposed part of the semiconductor substrate with a thickness equal to the film thickness of the film thickness control portion.

2. The method of manufacturing a semiconductor device according to claim 1, wherein, before forming the second hetero semiconductor layer, a part of the semiconductor substrate which has been exposed to the outside by selectively removing the part of the first hetero semiconductor layer is further selectively removed.

3. The method of manufacturing a semiconductor device according to claim 1, wherein
    the process of forming the first hetero semiconductor layer on the semiconductor substrate includes the step of doping the first hetero semiconductor layer with an impurity, and
    when the gate insulating film is formed, a part of the first hetero semiconductor layer whose crystal structure has become irregular due to the doping the first hetero semiconductor layer with the impurity is oxidized.

4. The method of manufacturing a semiconductor device according to claim 3, wherein a method of doping the first hetero semiconductor layer with the impurity is ion implantation.

5. The method of manufacturing a semiconductor device according to claim 1, wherein a method of oxidizing the film thickness control portion is thermal oxidation.

6. The method of manufacturing a semiconductor device according to claim 1, wherein the semiconductor substrate is made of any one of silicon carbide, diamond or gallium nitride.

7. The method of manufacturing a semiconductor device according to claim 1, wherein the first hetero semiconductor layer is made of any one of single-crystal silicon, polysilicon or amorphous silicon.

* * * * *